US011510332B2

(12) United States Patent
Sorel et al.

(10) Patent No.: US 11,510,332 B2
(45) Date of Patent: Nov. 22, 2022

(54) ELECTRICAL CONTROL DEVICE

(71) Applicant: SAFRAN ELECTRICAL & POWER, Blagnac (FR)

(72) Inventors: Stéphane Sorel, Blagnac (FR); Gael Blondel, Blagnac (FR); Erick Henry, Blagnac (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 0 days.

(21) Appl. No.: 17/264,435

(22) PCT Filed: Jul. 29, 2019

(86) PCT No.: PCT/FR2019/051866
§ 371 (c)(1),
(2) Date: Jan. 29, 2021

(87) PCT Pub. No.: WO2020/025890
PCT Pub. Date: Feb. 6, 2020

(65) Prior Publication Data
US 2021/0315122 A1    Oct. 7, 2021

(30) Foreign Application Priority Data

Jul. 30, 2018   (FR) ..................... 1857091

(51) Int. Cl.
*H05K 7/02*         (2006.01)
*H05K 7/04*         (2006.01)
(Continued)

(52) U.S. Cl.
CPC ......... *H05K 7/1422* (2013.01); *H05K 5/0017* (2013.01)

(58) Field of Classification Search
USPC ....................................................... 361/807
See application file for complete search history.

(56) References Cited

U.S. PATENT DOCUMENTS 4,181,387 A      1/1980  Walters
5,071,375 A  *  12/1991  Savage, Jr. .......... H01R 13/187
                                                                439/853
(Continued)

FOREIGN PATENT DOCUMENTS

EP           0057757 A2     8/1982
EP           2355638 A2     8/2011
(Continued)

OTHER PUBLICATIONS

International Search Report dated Nov. 8, 2019, issued in corresponding International Application No. PCT/FR2019/051866, filed Jul. 29, 2019, 3 pages.
(Continued)

*Primary Examiner* — Hung S. Bui
(74) *Attorney, Agent, or Firm* — Christensen O'Connor Johnson Kindness PLLC

(57) ABSTRACT

An electrical control device including at least one power module which further includes at least one controlled power switch, at least one control card attached to the power module, and electrical connection which connect the control card to the control module. The electrical connection includes at least one pin which is electrically connected and extends from the power module, or, respectively, the control card, and at least one receptacle which is electrically connected and mounted on the control card, or, respectively, the power module, the pin being inserted, at least partially, into the receptacle. The pin and the receptacle is designed to provide an electrical connection between them whilst allowing the pin to be removed from the receptacle.

10 Claims, 1 Drawing Sheet

(51) Int. Cl.
*H05K 7/14* (2006.01)
*H05K 5/00* (2006.01)

(56) References Cited

U.S. PATENT DOCUMENTS

| | | | |
|---|---|---|---|
| 5,509,814 A | 4/1996 | Mosquera | |
| 7,402,892 B1* | 7/2008 | Glaser | H04Q 1/146 |
| | | | 257/637 |
| 9,750,137 B2* | 8/2017 | Takahashi | H05K 1/18 |
| 2006/0052914 A1 | 3/2006 | Kubokawa et al. | |
| 2007/0284947 A1* | 12/2007 | Lee | H01L 25/165 |
| | | | 307/31 |
| 2011/0317374 A1 | 12/2011 | Merlet et al. | |
| 2012/0074542 A1 | 3/2012 | Soyano | |
| 2012/0250380 A1* | 10/2012 | Ichijyo | H05K 7/20927 |
| | | | 363/123 |
| 2018/0226324 A1* | 8/2018 | Kimura | H01L 25/18 |

FOREIGN PATENT DOCUMENTS

| | | |
|---|---|---|
| EP | 2368414 A1 | 9/2011 |
| EP | 3177123 A1 | 6/2017 |
| GB | 2547946 A | 9/2017 |

OTHER PUBLICATIONS

Written Opinion of the International Searching Authority dated Nov. 8, 2019, issued in corresponding International Application No. PCT/FR2019/051866, filed Jul. 29, 2019, 6 pages.

Written Opinion of the International Searching Authority dated Nov. 8, 2019, issued in corresponding International Application No. PCT/FR2019/051866, filed Jul. 29, 2019, 5 pages.

International Preliminary Report on Patentability dated Feb. 2, 2021, issued in corresponding International Application No. PCT/FR2019/051866, filed Jul. 29, 2019, 1 page.

* cited by examiner

ELECTRICAL CONTROL DEVICE

FIELD OF THE INVENTION

The invention relates to an electrical control device, intended in particular for the aeronautical field.

BACKGROUND OF THE INVENTION

An electrical control device conventionally comprises a power module which comprises power switches controlled by at least one control card. Examples of power switches are insulated gate field effect transistors, more commonly known as MOSFETs (Metal Oxide Semiconductor Field Effect Transistors) or Insulated Gate Bipolar Transistors, known as IGBTs (Insulated Gate Bipolar Transistors). The control card can be offset with respect to the power module or, on the contrary, can be attached to the said module so as to increase the compactness of the assembly and reduce the lengths of the electrical connections between the control card and the power module in order to limit interference.

The electrical connection means which connect said control card and said control module can be formed by one or more dedicated connectors each grouping together, within the same area, the various inputs or outputs to be connected. This requires adapting the control card and the power module so as to group the said inputs or outputs by areas. Moreover, such a solution is expensive and requires the use of a specific component, namely a connector.

Another known solution is to connect a pin to each concerned area of the power module in order to connect said area of the power module to a specific area of the control card. This type of implementation does not require the inputs and outputs to be grouped together in the same area of the control card and the power module.

The pins pass through openings in the control card and are soldered to the tracks on the control card, thus preventing or complicating the subsequent disassembly of the control card and the power module. Moreover, soldering operations are particularly tedious and expensive. In addition, a rise in the temperature of the pin at its end connected to the control card can generate a rise in the temperature at its other end, which can damage to the solder at this other end on the control module. Finally, such a rise in temperature can damage various components of the control card and/or the power module.

There can be numerous maintenance and testing phases, particularly in the aeronautical field. Such phases can require the disassembly of the control card and the power module, in order to replace one of these components, or to visually inspect the components, or to carry out tests on only one of these components, isolated from the other.

Another alternative consists in providing each electrical connection between the control card and the power module by means of a connection spring, coming to bear on a track of the control card or of the module. This type of implementation is not very adapted to vibrations, as these can cause the spring to come loose from the connection track. And, in the aeronautical field in particular, such vibratory phenomena can occur in different phases of aircraft operation.

SUMMARY OF THE INVENTION

The invention aims to remedy such drawbacks in a simple, reliable and inexpensive way.

To this end, the invention relates to an electrical control device comprising at least one power module which comprises at least one controlled power switch, at least one control card attached to the power module, and electrical connection means which connect said control card to said control module, characterised in that the electrical connection means comprise at least one pin which is electrically connected and extends from the power module, or, respectively, the control card, and at least one receptacle which is electrically connected and mounted on the control card, or, respectively, the power module, the pin being inserted, at least partially, into the receptacle, said pin and the receptacle being designed to provide an electrical connection between them whilst allowing the pin to be removed from said receptacle.

In this way, each pin can be inserted into the corresponding receptacle in such a way as to provide the electrical connection between the control card and the power module, while at the same time allowing disassembly of the latter, for example in the event of maintenance, replacement, visual inspection or testing of at least one of these elements.

In addition, there is no need to solder, and therefore to heat the pin. This prevents damage to the pre-existing soldering area between the pin and the rest of the power module, for example.

The receptacle can be soldered to the control card. The pin can comprise one end soldered to the power module and an opposite end engaged in the receptacle.

Such a device is particularly adapted to aeronautical constraints, which require a large number of maintenance or test phases before deployment of the control device on an aircraft.

The pin can be straight.

The receptacle can be made, at least partially, of electrically conductive material and comprises a hollow part into which extends at least one elastic member capable of coming to bear on the pin so as to establish the electrical connection between the receptacle and the pin.

The elastic member can be formed by an elastically deformable tab. The elastic member can be integrated into the hollow part. The said hollow part can be electrically connected, for example by soldering or any other suitable means, to a track or conductive element of the control card.

The receptacle can comprise at least two elastic members extending opposite to each other in said hollow part.

In this way, in the event of vibrations, even if the electrical connection between one of the elastic members and the pin is temporarily no longer provided, the other elastic member maintains the electrical connection between the receptacle and the pin, thus increasing the reliability of the electrical connection between the control card and the power module. Such vibration phenomena can occur during several phases of aircraft operation.

Each receptacle can comprise between four and eight tabs.

The power module can comprise a connection part to which the pin is connected, and a hollow body delimiting an internal volume with the connection part, the control card being attached to the body, the body comprising an opening through which the pin passes, the pin extending, at least partially, into said internal volume and passing through said opening, the control card being located outside said volume.

The control card can be attached to the body by means of screws or rivets. The screws or rivets can extend parallel to the pin.

In the case of attachment by screw, each screw can be engaged in a blind threaded part of the body. This prevents the entry of pollutants into the internal volume of the body through the threaded part of the body.

The body can be glued to the connection part of the power module. The body can be hermetically attached to said connection part so as to prevent the entry of pollutants.

The body can comprise at least one tubular element forming the opening through which the pin passes, said tubular element comprising a conical inner wall flared towards the connection part.

In this way, when mounting the body to the rest of the power module, the free end of the pin, i.e. the end of the pin opposite the connection part of the power module, can be guided through the conical wall into the tubular element before passing through it.

The body can comprise a so-called top wall, located on the side of the control card, the body comprising a part protruding from said top wall, the control card coming to bear on said protruding part.

In this way, a clearance is formed between the control card and the top wall of the body. This clearance is oriented along the axis of the pin and the tubular part. For example, this clearance is about several tenths of a millimetre.

The protruding parts where the pins are located prevent the introduction of pollutants, by gravity or run-off along the pins, especially liquid condensates. Such condensates can possibly be collected on the top wall of the body but cannot be introduced into the opening formed by the protruding tubular part of the top wall.

The opening through which the pin passes can be sized to form a clearance with the pin.

The pin can be cylindrical, and the opening can be circular. The diameter of this opening can be larger than the diameter of the pin. The clearance, oriented radially with respect to the pin axis, can be several tenths of a millimetre.

Such clearance compensates for any dimensioning or installation tolerances. This avoids exerting, on the pin, forces directed radially with respect to the pin axis. This limits, among other things, the buckling of the pin.

The free end of the pin that can be engaged in the receptacle is rounded or tapered.

The said free end of the pin can, for example, be hemispherical or ogive-shaped.

The receptacle can comprise a first open end through which the pin is engaged, said first end comprising a tapered portion flared towards the power module.

This flared conical part guides the pin and facilitates its insertion into the receptacle, in order to compensate for any dimensional or assembly tolerances.

The receptacle can comprise a second closed end opposite the first end.

This prevents the entry of pollutants into the internal volume of the body, through the second end of the receptacle and the opening through which the pin passes, formed in the body.

The invention will be better understood and other details, characteristics and advantages of the invention will appear when reading the following description, which is given as a non-limiting example, with reference to the attached drawings.

DETAILED DESCRIPTION

Figure 1:
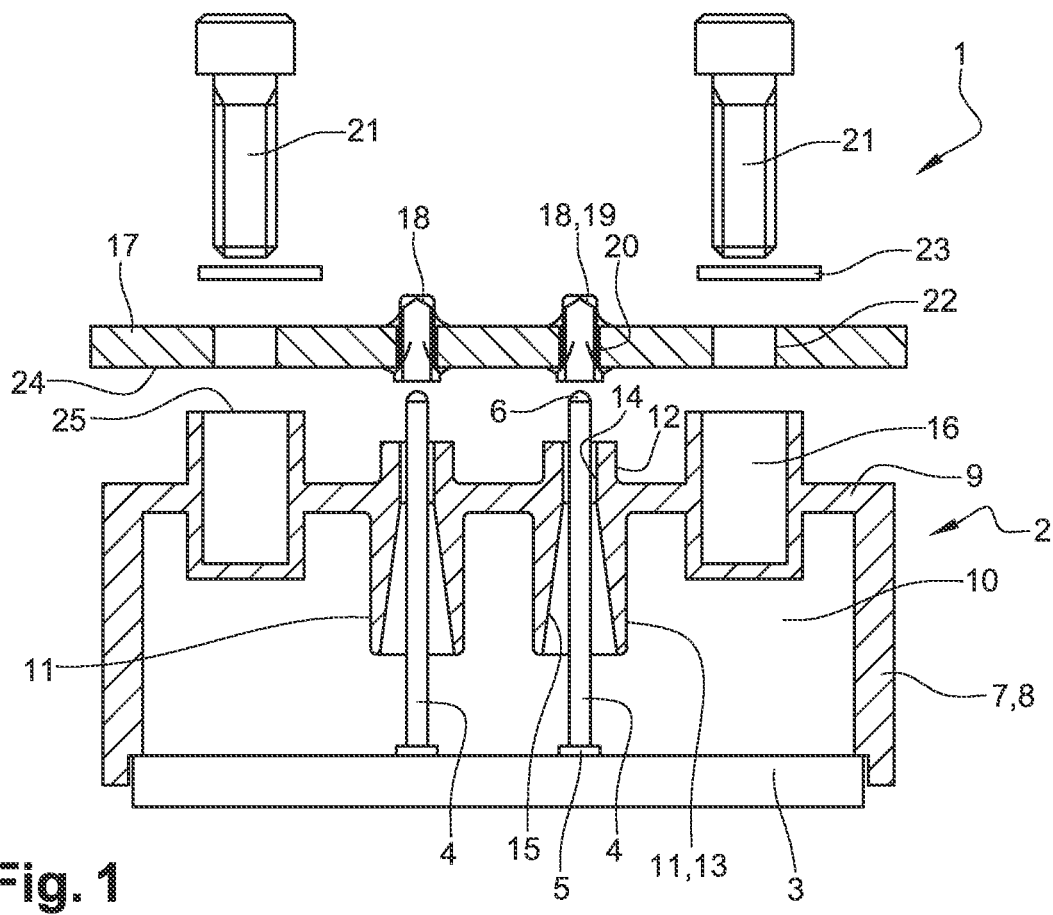
FIG. 1 is an exploded cross-sectional view of an electrical control device according to one embodiment of the invention.
Figure 2:
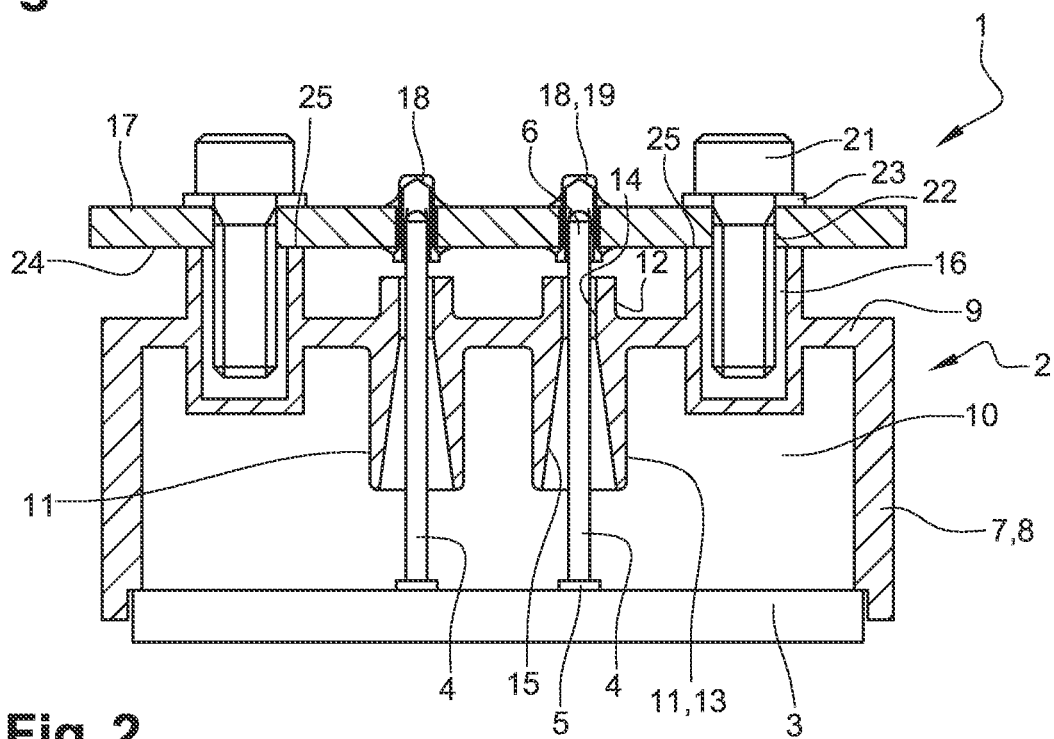
FIG. 2 is an assembled sectional view of said electrical control device.

FIGS. 1 and 2 show an electrical control device 1 comprising a power module 2 which comprises a connection part 3 comprising controlled power switches, such as, for example, insulated gate field effect transistors more commonly known as MOSFETs (Metal Oxide Semiconductor Field Effect Transistors) or insulated gate bipolar transistors, known as IGBTs (Insulated Gate Bipolar Transistors).

Cylindrical pins 4 extend in one axis from the connection part 3 upwards in the figures.

The pins 4 are metallic, e.g. copper. Each pin 4 comprises a first end 5, soldered to a connection track, and a second end 6, opposite the first end 5. The second end 6 has a rounded shape, e.g. hemispherical or ogive-shaped, or a conical shape. The first end 5 can be widened to strengthen the connection between the pin 4 and the connection part 3.

The power module 2 also comprises a plastic body 7 mounted on the connection part 3. The body 7 has a side wall 8, and a so-called top wall 9, opposite the connection part 3. The lower end of the side wall 8 is hermetically sealed to the connection part 3, e.g. by gluing.

The top wall 9, the side wall 8 and the connection part 3 delimit an internal volume 10 in which the power switches and, in part, the pins 4 are housed.

Tubular parts 11 extend along the axis of pins 4 from the top wall 9. A tubular part 11 is associated with each pin 4. Each tubular part 11 comprises an upwardly protruding part 12, i.e. opposite the connection part 3, and a downwardly protruding part 13. Each tubular part 11 comprises an annular inner surface. The top part 14 of each inner surface is cylindrical. The bottom part 15 of each inner surface is tapered and flared downwards, so as to facilitate the insertion of the second ends 6 of the pins 4 into the tubular parts 11.

The diameter of the cylindrical top part 14 is larger than the diameter of the pins 4, so as to form a radial clearance between each pin 4 and the associated tubular part 11.

In addition, the body 7 comprises threaded and blind fastening areas 16 running parallel to the pins 4 and to the tubular parts 11. The fastening areas 16 are open at the top.

The electrical control device 1 furthermore comprises a control card 17 comprising components suitable in particular for generating a control signal for the power switches.

The control card 17 comprises openings in which metal receptacles 18 are housed. Each receptacle 18 comprises a blind hollow part 19 comprising an open lower end and a closed upper end. The open lower end can comprise an inner surface with a tapered portion to facilitate guiding and insertion of the second end 6 of the corresponding pin 4. Each receptacle 18 also comprises elastically deformable tabs 20 (FIG. 1), made of the same material as the hollow part 19. The tabs 20 are evenly distributed around the circumference. The number of tabs 20 ranges from 4 to 8.

Each tab 20 bears elastically on the second end 6 of pin 4 so as to establish an electrical connection between the receptacle 18 and the pin 4 and, more generally, between the control card 17 and the connection part 3 of the power module 2. The tabs 20 allow the pin 4 to be removed from the receptacle 18.

The receptacles 18 are soldered to the connection tracks of the control card 17 and thus held firmly on said control card 17.

The control card 17 is attached to the body 7 by means of screws 21, which are inserted in the openings 22 of the control card 17 and screwed into the threaded fastening areas 16 of the body 7. A washer 23 is mounted between the head of each screw 21 and the control card 17.

The bottom surface 24 of the control card 17 bears on the upper ends 25 of the fastening areas 16 of the body 7, a clearance being formed between said bottom surface 24 of the control card 17 and the top wall 9 of the body 7.

The assembly of such a device 1 can be carried out as follows. First, the first ends 5 of the pins 4 are soldered to the connection part 3, then the body 7 is glued to the connection part 3. When mounting the body 7 on the connection part 3, the pins 4 are inserted into the conical parts 13, 15 of the tubular parts 11 to open above the tubular parts 11. In addition, the receptacles 18 are soldered to the control card 17, the assembly being then mounted on the body 7, so that the second ends 6 of pins 4 engage and connect electrically to the receptacles 18. The control card 17 is then screwed to the body 7 with screws 21.

Disassembly of the control card 17 can be carried out simply by removing the screws 21 and separating the control card 17 from the body 7. The control card 17 or power module 2 can then be replaced, tested independently of each other, cleaned or visually inspected, for example.

The invention claimed is:

1. An electrical control device comprising:
at least one power module which comprises at least one controlled power switch, at least one control card attached to the power module, and an electrical connection which connects said control card to said control module, wherein the electrical connection comprises at least one pin which is electrically connected and extends from the power module, or, respectively, the control card, and at least one receptacle which is electrically connected and mounted on the control card, or, respectively, the power module, the pin being inserted, at least partially, into the receptacle, said pin and the receptacle being configured to provide an electrical connection therebetween whilst allowing the pin to be removed from said receptacle.

2. The control device according to claim 1, wherein the receptacle is made, at least partially, of electrically conductive material and comprises a hollow part into which extends at least one elastic member capable of coming to bear on the pin, so as to establish the electrical connection between the receptacle and the pin.

3. The control device according to claim 2, wherein the receptacle comprises at least two elastic members extending opposite each other in said hollow part.

4. The control device according to claim 1, wherein the power module comprises a connection part to which the pin is connected, and a hollow body delimiting an internal volume with the connection part, the control card being attached to the body, the body comprising an opening for the passage of the pin, the pin extending, at least partially, into said internal volume and passing through said opening, the control card being located outside said volume.

5. The control device according to claim 4, wherein the body comprises at least one tubular element forming the opening for the passage of the pin, said tubular element comprising a conical inner wall flared towards the connection part.

6. The control device according to claim 5, wherein the body comprises a top wall, located on the side of the control card, the body comprising a part protruding from said top wall, the control card coming to bear on said protruding part.

7. The control device according to claim 4, wherein the opening for the passage of the pin is dimensioned so as to form a clearance with the pin.

8. The control device according to claim 1, wherein the free end of the pin engaged in the receptacle is rounded or conical.

9. The control device according to claim 1, wherein the receptacle comprises a first open end through which the pin is engaged, said first end comprising a conical portion flared towards the power module.

10. The control device according to claim 1, wherein the receptacle comprises a second closed end, opposite the first end.

* * * * *